United States Patent
Russell

(10) Patent No.: US 11,018,272 B2
(45) Date of Patent: May 25, 2021

(54) METHODS FOR FORMING METAL ELECTRODES CONCURRENTLY ON SILICON REGIONS OF OPPOSITE POLARITY

(71) Applicant: IMEC VZW, Leuven (BE)

(72) Inventor: Richard Russell, Leuven (BE)

(73) Assignee: IMEC VZW, Leuven (BE)

( * ) Notice: Subject to any disclaimer, the term of this patent is extended or adjusted under 35 U.S.C. 154(b) by 136 days.

(21) Appl. No.: 16/496,284

(22) PCT Filed: Mar. 8, 2018

(86) PCT No.: PCT/EP2018/055822
§ 371 (c)(1),
(2) Date: Sep. 20, 2019

(87) PCT Pub. No.: WO2018/172098
PCT Pub. Date: Sep. 27, 2018

(65) Prior Publication Data
US 2021/0119066 A1    Apr. 22, 2021

(30) Foreign Application Priority Data
Mar. 23, 2017    (EP) .................................... 17162597

(51) Int. Cl.
*H01L 21/768*    (2006.01)
*H01L 31/0224*    (2006.01)
(Continued)

(52) U.S. Cl.
CPC ...... *H01L 31/022425* (2013.01); *C23C 18/34* (2013.01); *C23C 18/44* (2013.01);
(Continued)

(58) Field of Classification Search
CPC ......... H01L 31/022425; H01L 31/0684; H01L 31/1804; H01L 31/0682; H01L 21/76874; H01L 21/2885; C23C 18/44; C23C 18/34
See application file for complete search history.

(56) References Cited

U.S. PATENT DOCUMENTS

| 4,482,596 | A | * | 11/1984 | Gulla | ...................... C23C 18/48 106/1.23 |
| 2012/0282722 | A1 | * | 11/2012 | Wenham | ......... H01L 31/022425 438/72 |

(Continued)

FOREIGN PATENT DOCUMENTS

WO    2016/193409 A1    12/2016

OTHER PUBLICATIONS

IEEE Journal of Photovoltaics, vol. 6, No. 2, Mar. 2016 (Year: 2016).*

(Continued)

*Primary Examiner* — Jarrett J Stark
(74) *Attorney, Agent, or Firm* — McDonnell Boehnen Hulbert & Berghoff LLP

(57) ABSTRACT

A method for concurrently forming a first metal electrode (31, 58) on an n-type region of a silicon substrate (10) and a second metal electrode (32, 59) on a p-type region of the silicon substrate, wherein the n-type region and the p-type region are respectively exposed in a first and in a second area, is disclosed. The method comprises: depositing (101) an initial metal layer comprising Ni (33, 53) simultaneously in the first area and in the second area by a Ni immersion plating process using a plating solution; and depositing (102) a further metal layer (34, 54) on the initial metal layer comprising Ni (33, 53) in the first area and in the second area by an electroless metal plating process or by an immersion metal plating process, wherein the plating solution com- (Continued)

prises Ni and a predetermined amount of another metal different from Ni.

20 Claims, 7 Drawing Sheets

(51) Int. Cl.
  *H01L 31/068* (2012.01)
  *C23C 18/44* (2006.01)
  *H01L 31/18* (2006.01)
  *C23C 18/34* (2006.01)
  *H01L 21/288* (2006.01)

(52) U.S. Cl.
  CPC ...... *H01L 31/0682* (2013.01); *H01L 31/0684* (2013.01); *H01L 31/1804* (2013.01); *H01L 21/2885* (2013.01); *H01L 21/76874* (2013.01)

(56) References Cited

U.S. PATENT DOCUMENTS

| | | | | |
|---|---|---|---|---|
| 2013/0249293 | A1* | 9/2013 | Yang | H02S 40/32 307/43 |
| 2014/0224313 | A1* | 8/2014 | Wu | H01L 31/0682 136/256 |
| 2015/0249163 | A1* | 9/2015 | Ozanne | H01L 31/02008 136/256 |
| 2016/0126369 | A1* | 5/2016 | Su | H01L 31/18 136/256 |
| 2016/0183380 | A1* | 6/2016 | Ishii | B32B 15/20 428/601 |
| 2016/0237571 | A1* | 8/2016 | Liu | C23C 28/345 |
| 2018/0083152 | A1* | 3/2018 | Yoshikawa | H01L 31/0504 |
| 2018/0277701 | A1* | 9/2018 | Lenes | H01L 31/1804 |
| 2019/0131236 | A1* | 5/2019 | Sato | H01L 24/92 |
| 2020/0337158 | A1* | 10/2020 | Dan | H05K 1/0277 |
| 2020/0373225 | A1* | 11/2020 | Chang | H01L 23/645 |

OTHER PUBLICATIONS

Proceedings of the Sixteenth IEEE Photovoltaic Specialists Conference, Sep. 1982 (Year: 1982).*

PCT International Search Report and Written Opinion, PCT International Application No. PCT/EP2018/055822, dated Apr. 9, 2018, 17 pages.

Kyeong, D. et al., "Approaching 20%-Efficient Selective-Emitter Solar Cells With Copper Front Contacts on Industrial 156 mm CZ SI Wafers", 27th European Photovoltaic Solar Energy Conference, Proceedings of the 27th International Conference, Oct. 31, 2012, pp. 600-603.

Cornagliotti, E. et al., "Bifacial n-PERT Cells (Bi-PERT) With Plated Contacts for Multi-Wire Interconnection", 32nd European Photovoltaic Solar Energy Conference and Exhibition, 2016, pp. 420-425.

Guo, Jiun-Hua et al., "Metallization Improvement on Fabrication of Interdigitated Backside and Double Sided Buried Contact Solar Cells", Solar Energy Materials & Solar Cells, Vol. 86, 2005, pp. 485-498.

Bassi, Nicolas et al., "GRID Touch, Innovative Solutions for Accurate IV Measurement of Busbarless Cells in Production and Laboratory Environments", Proc. of 29th European Photovoltaic Solar Energy Conference and Exhibition. 2014, 6 pages.

* cited by examiner

METHODS FOR FORMING METAL ELECTRODES CONCURRENTLY ON SILICON REGIONS OF OPPOSITE POLARITY

This application is a U.S. national phase application of international application no. PCT/EP2018/055822 filed on Mar. 8, 2018, which claims priority to European patent application no. EP 17162597.3 filed on Mar. 23, 2017, the contents of both being incorporated by reference in their entirety.

FIELD

The present disclosure relates to plating-based methods for forming metal electrodes concurrently, for example simultaneously, on n-type regions and on p-type regions of a silicon substrate.

Furthermore, the present disclosure relates to methods for fabricating photovoltaic cells, such as bifacial photovoltaic cells or back-contact photovoltaic cells, wherein metal electrodes are formed concurrently, for example simultaneously, on n-type silicon regions and on p-type silicon regions by plating-based methods.

STATE OF THE ART

Two important objectives of the photovoltaic industry are improving the photovoltaic cell and module efficiency, and reducing the cell and module manufacturing costs. A possible route towards improving the photovoltaic cell and module efficiency is the use of bifacial photovoltaic cells. A possible route towards reducing the cell and module manufacturing cost is the use of cheaper materials for the metallisation, as an alternative to traditional methods of metallisation that are based on silver (Ag) paste.

A known alternative to Ag paste based metallisation for forming metal electrodes of silicon photovoltaic cells is Ni/Cu-based metallisation. In this approach, a thin nickel (Ni) layer is first deposited for providing a low contact resistance to the silicon, as a diffusion barrier to the main conductor, copper (Cu), and as a seed layer for forming a Cu layer on top of the thin nickel layer. The Cu layer is used for providing a good electrical conductivity and thus a low electrical resistance of the metal electrodes. It is common practice to cover the Cu layer with a thin layer of Sn or Ag to improve solderability.

A typical process flow for a Ni/Cu based metallisation process comprises: forming a dielectric layer, e.g. an anti-reflection coating, over the entire silicon surface, locally removing the dielectric layer, thereby exposing the underlying silicon surface at locations where metal contacts are to be formed, and forming the metal contacts at the exposed silicon regions by metal plating. Common plating methods used for depositing such Ni/Cu stacks are light induced plating, electroplating and field induced plating. It is a disadvantage of these methods that they require electrical contacting of the silicon substrate and that they require an external current or voltage source and/or controlled illumination. For depositing the Ni layer, electroless plating may be used.

For example, in electroless plating, auto-catalytic chemical plating techniques may be used to deposit a layer of nickel or nickel alloy, e.g. by using chemical reactions in an aqueous solution that do not require the application of an external electrical power. However, it is generally a disadvantage of an electroless plating process that it results in a poor thickness uniformity due to e.g. non-uniform nucleation and the tendency of Ni to preferentially plate on the most conductive areas. Also, for depositing the Cu layer on top of the Ni seed layer, electroless plating may be used. However, electroless Cu plating is generally very slow, e.g. more than a factor of ten slower than electroplating, and more frequent bath renewals are required, leading to an increased generation of waste material.

"Metallization improvement on fabrication of interdigitated backside and double sided buried contact solar cells", Solar Energy Materials & Solar Cells 86 (2005) 485-498, Jiun-Hua Guo et al. describes a process for nucleation of a nickel layer on both phosphorus and boron diffused contact areas based on immersion palladium chloride activation of the plating surfaces. However, this approach requires an additional step for the surface activation. Furthermore, the use of palladium results in an increased manufacturing cost. Using this approach, it may also be difficult to avoid spurious plating or ghost plating. "Bifacial n-PERT cells (Bi-PERT) with plated contacts for multi-wire interconnection", Proceedings of the 32nd EPVSEC (2016) 420-424, E. Cornaglotti et al. describes a fully plated Ni/Ag metallization sequence wherein first a Ni layer is deposited simultaneously on n+ and p+ doped regions by a plating process not requiring electrical contacts and wherein the plated Ni layer is then thickened by an e-Ni/i-Ag (electroless Ni/immersion Ag) plating sequence. Results of experiments are reported wherein bifacial photovoltaic cells are fabricated using such a fully plated Ni/Ag metallization sequence for forming the electrodes. When comparing the electrical characteristics of such fully plated cells with the electrical characteristics of similar photovoltaic cells wherein the electrodes are formed by first depositing a Ni layer by sputtering followed by sintering to form a nickel silicide layer, and then thickening the sputtered Ni layer by the e-Ni/i-Ag plating sequence, it was observed that the fully plated cells have a lower open-circuit voltage Voc and a lower fill factor FF, and therefore also a lower cell efficiency. This was attributed to an increased recombination activity in the contact area.

Hence, there is a need for an improved method for forming metal electrodes that may result in photovoltaic cells with a good cell efficiency and a reduced photovoltaic cell manufacturing cost.

SUMMARY

It is an object of the present disclosure to provide good methods for concurrently forming a first metal electrode on an n-type region of a silicon substrate and a second metal electrode on a p-type region of the silicon substrate, based on non-contact plating processes only.

It is an advantage of the present disclosure that methods for concurrently forming a first metal electrode on an n-type region of a silicon substrate and a second metal electrode on a p-type region of the silicon substrate may be provided, based on non-contact plating processes only, with a reduced or limited damage to the underlying silicon surface.

It is an advantage of the present disclosure that methods for fabricating silicon photovoltaic cells may be provided wherein electrodes of opposite polarity are concurrently formed based on non-contact plating processes only, with a reduced or limited degradation of the electrical cell characteristics, for example with a reduced or limited degradation of the cell characteristics as compared to cells fabricated using known methods based on non-contact plating processes only.

The above objectives are at least partially accomplished by methods according to the present disclosure.

According to a first aspect the disclosure is related to a method for concurrently forming a first metal electrode on an n-type region of a silicon substrate and a second metal electrode on a p-type region of the silicon substrate.

A method for concurrently forming a first metal electrode on an n-type region of a silicon substrate and a second metal electrode on a p-type region of the silicon substrate, wherein the n-type region is exposed in a first area and wherein the p-type region is exposed in a second area, is provided, the method comprising: depositing an initial metal layer comprising Ni simultaneously in the first area and in the second area by performing a Ni immersion plating process using a plating solution; and depositing a further metal layer on the initial metal layer comprising Ni in the first area and in the second area by performing an electroless metal plating process or by performing an immersion metal plating process, wherein the plating solution comprises Ni and a predetermined amount of another metal different from Ni.

It should be noted that in the context of this application the term "electroless metal plating process" refers to a technique of plating metal by chemical rather than by electrical means, in which the piece to be plated is contacted with a solution comprising reducing agent (e.g. immersed in a reducing agent) that, when catalysed by certain materials, changes metal ions to metal that forms a deposit on the piece. Electroless plating is a non-galvanic plating method without the use of external electrical power. It uses chemical interactions rather than an electric current to cause a metal coating to adhere to a surface.

It should be noted that in the context of this application the term "immersion metal plating process" refers to galvanic displacement, a technique of plating taking place when a reductant base material is displaced by a metal ion oxidant in solution that has a higher reduction potential than the oxidant of a redox couple to which the reductant base material belong. The base material is dissolved into the solution; meanwhile the metallic ions in the solution are reduced on the surface of the base material. Such a mechanism differs from autocatalytic or electroless plating because, in immersion plating, reducing agents are not required in the solution to reduce the metal ion oxidant to metal, as the base material behaves as the reducing agent.

In the case of $Cu^{2+}$ as the metal ion oxidant and Si as the reductant base material, the galvanic displacement is preferably performed in a solution capable of solubilizing the oxidation product of Si. Typically, this solution comprises fluoride ions. For instance, it can be a $NH_4F$ solution, such as a 30 wt % $NH_4F$ solution. Although galvanic displacement on Si can occur at a pH below 7, for the deposition of $Cu^{2+}$, the solution preferably may have a pH above 7, preferably above 8.

It is an advantage of embodiments of the method of the present disclosure that it allows forming metal electrodes concurrently, for example simultaneously, on regions of opposite polarity, e.g. concurrently on a p-doped region and on an n-doped region of a silicon substrate, with a desired thickness uniformity within each region.

It is an advantage of embodiments of the method of the present disclosure that it is based on a process using plating steps only. For example, when using some other plating methods known in the art, such as light induced plating or field induced plating, it is generally not possible to concurrently deposit a metal directly on n-type silicon regions and on p-type silicon regions.

For example, light-induced plating can generally only be used for metallizing n-type regions and not for metallizing p-type regions, while field-induced plating can generally only be used for metallizing p-type regions and not for n-type regions.

It is an advantage of embodiments of the method of the present disclosure that it only uses non-contact plating steps, i.e. plating steps not requiring electrical contacting of the substrate and not requiring an external current or voltage source.

It is an advantage of embodiments of the method of the present disclosure that it only uses plating steps not requiring controlled illumination during plating.

It is an advantage of embodiments of the method of the present disclosure that the metal electrodes can be provided with reduced ghost plating, e.g. with reduced deposition of a metal at undesired locations on the silicon surface.

It is an advantage of embodiments of the method of the present disclosure that metal electrodes can be provided selectively on the desired locations on the silicon surface, with respect to dielectric regions, without needing to deposit and/or remove a mask.

It is an advantage of embodiments of the method of the present disclosure that, by using an immersion plating process for forming the initial metal layer comprising Ni, a desired coverage of the first area and the second area with a desired thickness uniformity within each area may be obtained, with a reduced or limited damage to the underlying silicon surface, e.g. with a reduced or limited damage that may lead to an increased recombination activity in the contact areas.

It is an advantage of embodiments of the method of the present disclosure that the initial metal layer comprising Ni may be made thicker substantially independent of the polarity of the silicon substrate surface underlying the initial metal layer comprising Ni, by depositing a further metal layer by electroless plating or immersion plating.

It is an advantage of embodiments of the method of the present disclosure that they can be applied on a large scale with good wafer to wafer uniformity. For instance, a batch of 25 wafers plated together in one cassette showed after electroless Ni plating a Ni amount per wafer within 15% across the cassette on the p-side and within 30% across the cassette on the n-side. When the same experiment was performed with Ag instead of Ni, Ag amount per wafer was within 25% across the cassette on the p-side and on the n-side.

It is an advantage of embodiments of the present invention that the Ni immersion plating solution involved may be very stable in time. The lifetime of the Ni immersion plating solution was of at least several months.

In embodiments of the present disclosure the other metal different from Ni may have a redox potential that is higher than the redox potential of Ni, which is advantageous in that it may result in an increased deposition rate of the initial metal layer comprising Ni, allowing a reduction of an immersion plating temperature and/or a reduction of an immersion plating duration for forming the initial metal layer comprising Ni.

In embodiments of the present disclosure the other metal different from Ni may be Cu (copper), which is advantageous in that Cu may provide a good electrical conductivity and thus a low electrical resistance of the metal electrodes.

In embodiments of the present disclosure the predetermined amount of the other metal different from Ni in the plating solution may for example be in the range between 0.1 mM and 25 mM, such as for example between 0.2 mM and 25 mM, for example in the range between 0.4 mM and 5 mM.

In embodiments of the present disclosure the predetermined amount of the other metal different from Ni in the plating solution may be lower than, for example substantially lower than, an amount of Ni that is present in the plating solution. In embodiments of the present disclosure the amount of Ni in the plating solution may for example be in the range of 250 ppm to 350 ppm and the predetermined amount of the other metal different from Ni in the plating solution may for example be in the range between 5 ppm and 250 ppm, such as for example between 5 ppm and 100 ppm, for example in the range between 20 ppm and 50 ppm.

In embodiments of the present disclosure depositing the further metal layer may comprise depositing the further metal layer on the initial metal layer comprising Ni simultaneously in the first area and in the second area, which is advantageous in that the number of process steps for forming the first and second metal electrodes may be reduced.

In embodiments of the present disclosure depositing the further metal layer may comprise depositing a further Ni layer, which is advantageous in that it may lead to lower process costs, more in particular to lower material related costs, as compared to other further metal layers such as for example Cu metal layers. In embodiments of the present disclosure depositing the further Ni layer may comprise performing an electroless Ni plating process, which is advantageous in that it is a non-self-limiting plating process, as opposed to for example immersion metal plating processes.

In embodiments of the present disclosure the method may further comprise forming a solderable capping layer above the further Ni layer, which is advantageous in that it results in the formation of first metal electrodes and second metal electrodes to which electrically conductive elements such as for example electrically conductive wires may be connected by soldering, with a low electrical contact resistance between the electrically conductive elements and the metal electrodes.

In embodiments of the present disclosure forming the solderable capping layer may comprise forming a Ag (silver) layer by performing a Ag plating process, which is advantageous in that the Ag layer not only improves solderability of the metal electrodes but that it additionally improves the electrical conductivity of the metal electrodes. For this step, a temperature higher than 48° C. is preferred (e.g. from 49 to 60° C.). For this step, a Ag plating time larger than 2 minutes is preferred (e.g. from 3 to 10 minutes).

In embodiments of the present disclosure forming the solderable capping layer may comprises forming a Ag layer by performing a Ag immersion plating process, which is advantageous in that an immersion plating process is a non-contact plating process. The Ag layer may for example have a thickness in the range between 150 nm and 600 nm.

In embodiments of the present disclosure depositing the further metal layer may comprise depositing a Ag layer, which is advantageous in that the Ag layer improves the solderability of the metal electrodes and that it improves the electrical conductivity of the metal electrodes. In embodiments of the present disclosure depositing the further Ag layer may comprise performing an electroless Ag plating process or performing an immersion Ag plating process, which is advantageous in that these plating processes are non-contact plating processes.

In embodiments of the present disclosure the method may further comprise performing a sintering step, for example at a temperature in the range between 250° C. and 450° C., which is advantageous in that such a sintering step may result in a reduction of the contact resistance between the first metal electrode and the underlying n-type region of the silicon substrate and a reduction of the contact resistance between the second metal electrode and the underlying p-type region of the silicon substrate.

In embodiments of the present disclosure the method may further comprise performing a step of contacting the initial metal layer, the completed further metal layer or an intermediate in the completion of the further metal layer to an HF solution. The HF solution preferably has a concentration of from 0.5 to 5 wt %, preferably from 1 to 3 wt %. The contact time with the HF solution may for instance be from 30 to 120 s, preferably from 45 to 75 s.

In embodiments of the present disclosure the first area and the second area may be located at a same side of the silicon substrate. The n-type region and the p-type region may thus be exposed at a surface of the silicon substrate on the same side of the substrate. This is advantageous in that it allows concurrently forming metal electrodes on silicon regions of opposite polarity located at a same substrate side, such as for example in a fabrication method of back-contact photovoltaic cells, i.e. photovoltaic cells having contacts of opposite polarities at their back side.

In embodiments of the present disclosure the first area and the second area may be located at opposite sides of the silicon substrate. The n-type region may thus be exposed at a first surface of the silicon substrate and the p-type region may be exposed at a second surface of the silicon substrate, wherein the first surface and the second surface are at opposite sides of the silicon substrate. This is advantageous in that it allows concurrently forming metal electrodes on silicon regions of opposite polarity located on different, opposite, sides of a substrate, such that it enables a double-side metallisation process. Such a double-side metallisation process may for example advantageously be used in a fabrication method for of bifacial photovoltaic cells.

According to a second aspect the disclosure is related to a method for fabricating a bifacial photovoltaic cell, the method comprising concurrently forming a first metal electrode on an n-type region of a silicon substrate and a second metal electrode on a p-type region of the silicon substrate according to an embodiment of the first aspect.

In general, features of this aspect of the disclosure provide similar advantages as discussed above in relation to the first aspect of the disclosure.

According to a third aspect the disclosure is related to a method for fabricating a back-contact photovoltaic cell, the method comprising concurrently forming a first metal electrode on an n-type region of a silicon substrate and a second metal electrode on a p-type region of the silicon substrate according to an embodiment of the first aspect.

In general, features of this aspect of the disclosure provide similar advantages as discussed above in relation to the first aspect of the disclosure.

It is an advantage of embodiments of the methods according to the second aspect and the third aspect of the present disclosure that they may be used for concurrently providing metal electrodes of opposite polarity in a process for fabricating silicon photovoltaic cells with a substantially reduced degradation of the electrical characteristics of the silicon photovoltaic cells as compared to processes known in the art based on non-contact plating processes only.

It is an advantage of embodiments of the methods according to the second aspect and the third aspect of the present disclosure that they may result in photovoltaic cells with electrical cell characteristics that are comparable to, i.e. substantially as good as, electrical cell characteristics that may be obtained for similar photovoltaic cells wherein the electrodes are formed by methods comprising a process step different from non-contact plating, such as for example PVD (Physical Vapor Deposition), e.g. sputtering.

It is an advantage of embodiments of the methods according to the second aspect and the third aspect of the present disclosure that they may be used for providing metal electrodes (e.g. metal fingers) to busbar-free photovoltaic cells, such as for example in a multi-wire interconnection approach. Such busbar-free photovoltaic cells may be further contacted and/or interconnected after finishing the cell fabrication process by soldering a plurality of electrically conductive wires to the metal electrodes. These electrically conductive wires replace the busbars of a conventional photovoltaic cell and are provided for collecting an electrical current from the metal electrodes of the cell. The plurality of electrically conductive wires, such as for example 10 to 50 metal wires, are provided after cell processing, for example during a module fabrication process.

It is an advantage that for such busbar-free photovoltaic cells the electrical conductivity of the metal electrodes can be lower as compared to 'standard' or conventional photovoltaic cells having typically three to five busbars. Therefore, metals having a lower electrical conductivity than Ag or Cu can be used for forming the electrodes of the busbar-free cells with a low risk of significantly increasing the electrical resistance of the metallisation pattern. An example of such a metal with lower electrical conductivity that may be used instead of only Ag or Cu is Ni. It is an advantage that Ni is a cheaper material than Ag or Cu. In preferred embodiments a thin Ag layer is provided on top of the Ni layer, e.g. by immersion Ag plating, to enable soldering of metal wires to the metal electrodes and to further improve the electrical conductivity of the metal electrodes. The thickness of such Ag layer may for example be in the range between 150 nm and 600 nm. Alternatively, for such busbar-free photovoltaic cells, a metal having a good electrical conductivity such as Ag may be used for forming the electrodes, e.g. for forming the further metal layer on an initial metal layer comprising Ni, with a reduced thickness as compared to a thickness required for 'standard' photovoltaic cells having typically three to five busbars. It is an advantage of such a reduced thickness that it results in a cost reduction.

It is an advantage of embodiments of the method of the present disclosure that they allow batch processing of large numbers of wafers or substrates in relatively cheap tools with small footprints with relatively short processing times, such that for example silicon photovoltaic cells may be fabricated with high throughput at low capex costs.

It is an advantage of embodiments of the methods of the present disclosure that the use of relatively expensive materials such as silver may be reduced as compared to known metallisation processes (e.g. based on silver screen printing) such that material costs, more in particular metal costs, may be reduced, thereby also reducing capex costs related to e.g. silicon photovoltaic cell fabrication.

Particular and preferred aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

FIG. 8 (middle) shows a side view of the nickel plating on the p-surface as observed by an electronic microscope. FIG. 8 (bottom) shows a top view of the nickel plating on the p-surface as observed by an electronic microscope.

Figure 1:
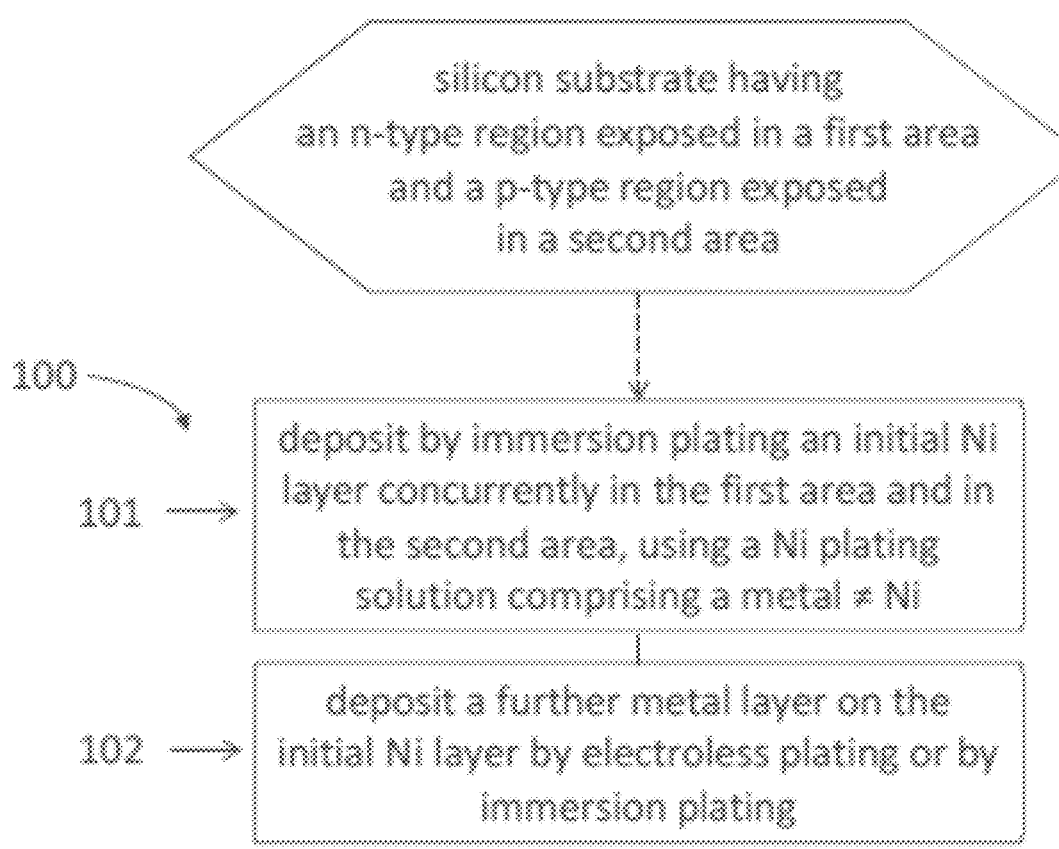
FIG. 1 schematically shows process steps of an exemplary method for forming metal electrodes concurrently on an area of n-type regions and on an area of p-type regions of a silicon substrate according to an embodiment of the present disclosure.

In the different figures, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

In the context of the detailed description provided hereinbelow, the front surface or front side of a photovoltaic cell or of a photovoltaic module is the surface or side adapted for being oriented towards a light source and thus for receiving illumination. In case of bifacial photovoltaic cells or modules, both surfaces are adapted to receive impinging light. In such case, the front surface or front side is the surface or side adapted for receiving the largest fraction of the light or illumination. The back surface, rear surface, back side or rear side of a photovoltaic cell or a photovoltaic module is the surface or side opposite to the front surface or side.

In the context of the detailed description provided hereinbelow, a busbar is an electrically conductive strip for collecting an electrical current, e.g. a current generated under illumination, from a plurality of metal contacts or metal electrodes provided on a surface of a photovoltaic cell. A busbar is provided for direct electrical connection with an external electrical lead. A busbar typically collects the electrical current from finer or narrower metal contacts, also called metal fingers, on the cell. These finer or narrower metal contacts collect an electrical current from the cell and deliver the current to the busbars; they are typically not provided for direct electrical connection to an external electrical lead.

In the context of the detailed description provided hereinbelow, a busbar-free photovoltaic cell is a photovoltaic cell not having busbars. A busbar-free photovoltaic cell typically comprises a plurality of metal contacts or metal electrodes on a surface of the cell but after cell fabrication it does not comprise an electrically conductive element for collecting current from the plurality of metal contacts. After finishing the cell processing, for example during module fabrication, electrically conductive elements such as for example electrically conductive wires are electrically connected to the plurality of metal contacts. These electrically conductive elements are provided for collecting an electrical current from the plurality of metal electrodes and they replace the conventional busbars.

The present disclosure provides a method for concurrently, e.g. simultaneously, forming metal electrodes on an n-type region (or n-type regions) and on a p-type region (or p-type regions) of a silicon substrate with a good or desired thickness uniformity within each region. The method furthermore may be based on a plating process wherein no electrical or physical contact to the silicon substrate is needed during plating and wherein no controlled illumination is needed during plating. The method is compatible with high volume batch processing. When using a method in accordance with an embodiment of the present disclosure in a fabrication process of silicon photovoltaic cells, degradation of the electrical characteristics of the silicon photovoltaic cells may be substantially reduced or even avoided as compared to known fabrication processes of silicon photovoltaic cells wherein only non-contact plating processes known in the art are used.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

In a first aspect, embodiments of the present disclosure provide a method for concurrently, such as for example simultaneously, forming a first metal electrode on an n-type region of a silicon substrate and a second metal electrode on a p-type region of the silicon substrate, wherein the n-type region is exposed in a first area and wherein the p-type region is exposed in a second area. FIG. 1 schematically shows process steps of an exemplary method 100 for forming first and second metal electrodes according to an embodiment of the present disclosure.

A method 100 according to an embodiment of the present disclosure may be performed on a silicon substrate or on a substrate comprising a silicon substrate, the silicon substrate comprising an n-type region and a p-type region, wherein the n-type region is exposed in a first area and wherein the p-type region is exposed in a second area. Process steps of an exemplary method 100 according to an embodiment of the present disclosure are illustrated in FIG. 1. The exemplary method comprises: depositing (101) an initial metal layer comprising Ni simultaneously in the first area and in the second area by performing a Ni immersion plating process using a plating solution comprising Ni and a predetermined amount of another metal different from Ni; and depositing (102) a further metal layer on the initial metal layer comprising Ni in the first area and in the second area by performing an electroless metal plating process or by performing an immersion metal plating process. In embodiments of the present disclosure the first area and the second area of the silicon substrate may be exposed at a surface of the silicon substrate and may be located at a same side of the substrate. In embodiments of the present disclosure the first area and the second area may be exposed at a surface of the silicon substrate and may be located at different, opposite sides of the substrate.

Figure 2:
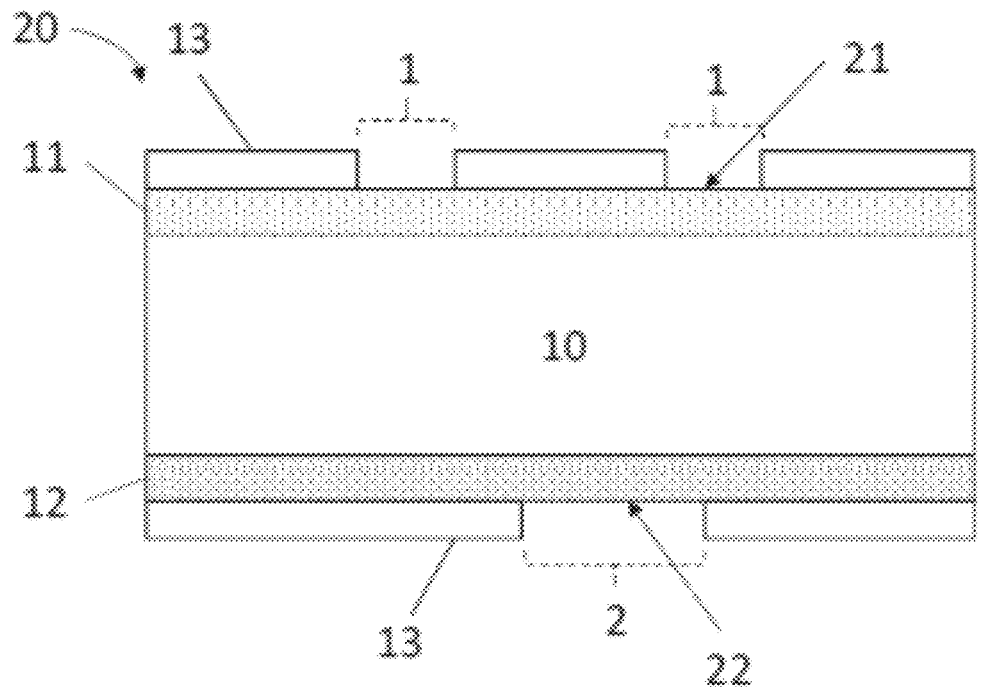
FIG. 2 schematically shows an example of a cross section of a substrate having an n-type region exposed in a first area and a p-type region exposed in a second area, the first area and the second area being located at opposite sides of the substrate, to illustrate features and properties of embodiments of the present disclosure.
Figure 3:
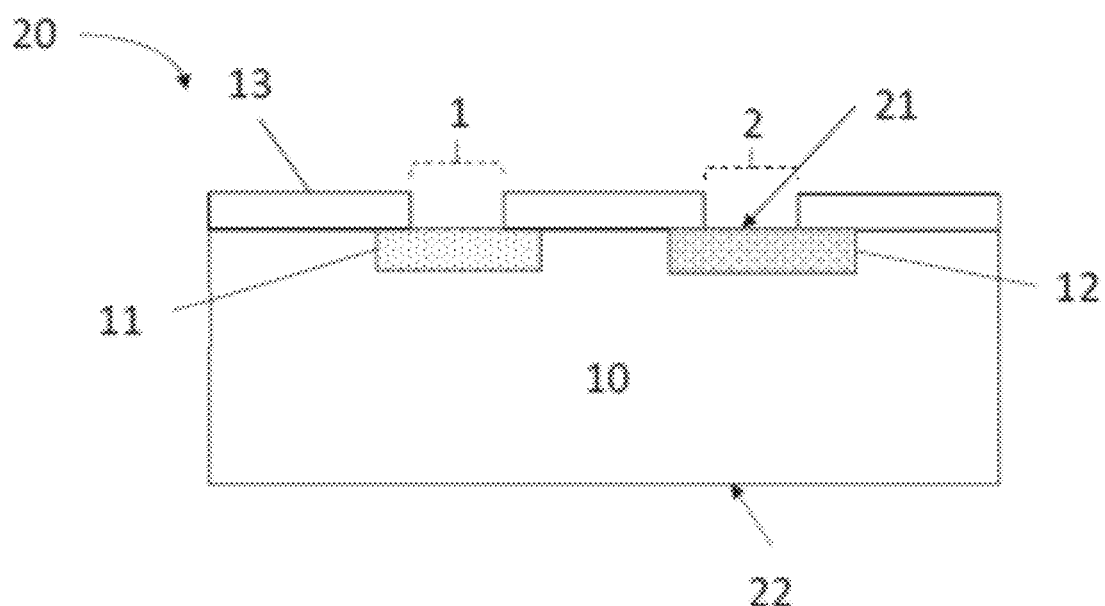
FIG. 3 schematically shows an example of a cross section of a substrate having an n-type region exposed in a first area and a p-type region exposed in a second area, the first area and the second area being located at a same side of the substrate, to illustrate features and properties of embodiments of the present disclosure.

Examples of structures or substrates 20 that may be used in embodiments of the present disclosure are schematically shown in FIG. 2 and in FIG. 3. FIG. 2 shows an example of a cross section of a substrate 20 comprising a silicon substrate 10 having an n-type region 11 that is exposed at a first substrate surface 21 in a first area 1, the silicon substrate 10 further comprising a p-type region 12 that is exposed at a second substrate surface 22 in a second area 2. In the example shown in FIG. 2, the first area 1 and the second area 2 are located at opposite sides (at opposite surfaces 21 and 22) of the silicon substrate 10. FIG. 3 shows an example of a cross section of a substrate or structure 20 comprising a silicon substrate 10 having an n-type region 11 that is exposed at a first substrate surface 21 in a first area 1, the silicon substrate 10 further comprising a p-type region 12 that is exposed at the same first substrate surface 21 in a second area 2. In the example shown in FIG. 3, the first area 1 and the second area 2 are located at a same side of the silicon substrate 10.

In areas where the n-type region 11 and the p-type region 12 are not exposed, a layer 13, such as a dielectric layer, may be present on the substrate surfaces 21, 22. FIG. 2 and FIG. 3 show a single n-type region and a single p-type region. However, embodiments of the present disclosure are not limited thereto. For example, in embodiments of the present disclosure the silicon substrate may comprise a plurality of p-type regions and/or a plurality of n-type regions on which metal electrodes may be formed simultaneously or concurrently. In the cross section of the example shown in FIG. 2 the first area 1 comprises two distinct parts and the second area 2 consists of a single part. However, embodiments of the present disclosure are not limited thereto. For example, in embodiments of the present disclosure the first area 1 and/or the second area 2 may comprise distinct parts, connected parts, e.g. connected parts with spaces therein between, or they may consist of a single part.

Figure 4:
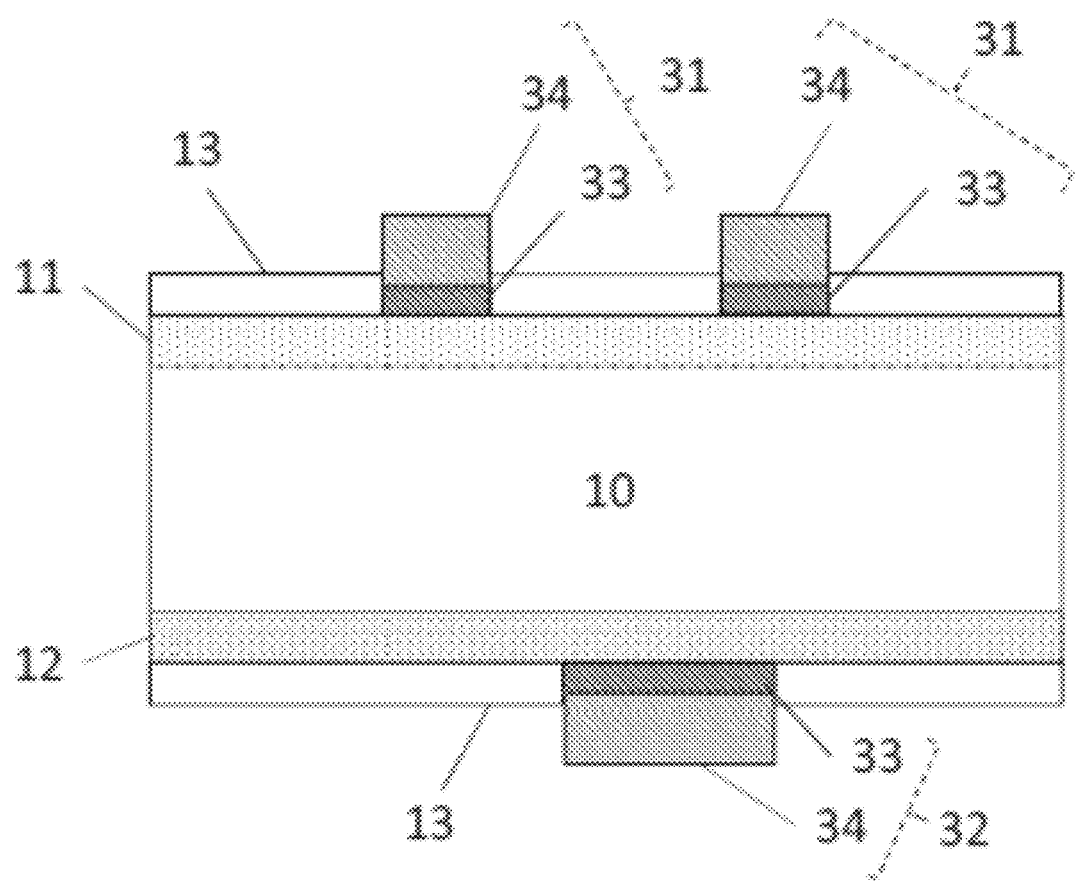
FIG. 4 schematically shows the structure of FIG. 2, after forming a first metal electrode and a second metal electrode by a method in accordance with an embodiment of the present disclosure.
Figure 5:
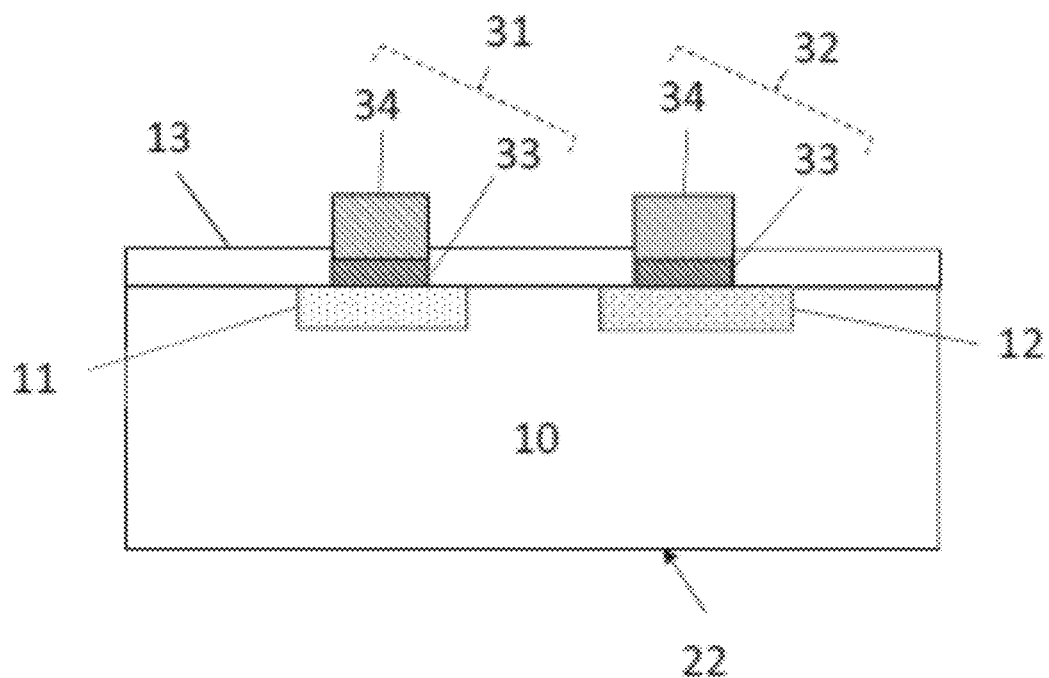
FIG. 5 schematically shows the structure of FIG. 3, after forming a first metal electrode and a second metal electrode by a method in accordance with an embodiment of the present disclosure.

FIG. 4 and FIG. 5 show exemplary structures, corresponding to the exemplary substrates illustrated in FIG. 2 and FIG. 3 respectively, that may be obtained after forming a first metal electrode 31 in the first area 1 and a second metal electrode 32 in the second area 2, as provided by a method according to embodiments of the present disclosure. In the example shown, the first metal electrode 31 and the second metal electrode 32 comprise a stack of an initial metal layer comprising Ni 33 formed by Ni immersion plating and a further metal layer 34 on top of the initial metal layer comprising Ni 33, according to embodiments of the present disclosure.

In a method 100 according to an embodiment of the present disclosure, as schematically in FIG. 1, depositing (FIG. 1, step 101) an initial metal layer comprising Ni in the first area and in the second area comprises performing a nickel immersion plating process (also called galvanic displacement plating process) using a plating solution comprising Ni and a predetermined amount of another metal different from Ni.

In embodiments of a method according to the first aspect of the present disclosure the other metal different from Ni may be a metal having a redox potential that is higher than the redox potential of Ni. For example, in examples of embodiments of the present disclosure the other metal different from Ni may be Cu. The redox potential of Ni versus the Normal Hydrogen Electrode (NHE) potential is −0.23V. The redox potential of Cu versus the NHE potential is 0.34V. Another metal that may for example be used as the other metal different from Ni is Ag, having a redox potential versus NHE potential of 0.78V, the present disclosure not being limited thereto.

In embodiments of the present disclosure the predetermined amount of the other metal different from Ni in the plating solution may for example be in the range between 0.1 mM and 25 mM, such as for example between 0.2 mM and 25 mM, for example in the range between 0.4 mM and 5 mM. Suitable amounts of the other metal different from Ni may be determined experimentally.

In embodiments of the present disclosure the predetermined amount of the other metal different from Ni in the plating solution may be lower than, for example substantially lower than, an amount of Ni that is present in the plating solution. In embodiments of the present disclosure the amount of Ni in the plating solution may for example be in the range of 250 ppm to 350 ppm and the predetermined amount of the other metal different from Ni in the plating solution may for example be in the range between 5 ppm and 250 ppm, such as for example between 5 ppm and 100 ppm, for example in the range between 20 ppm and 50 ppm.

After depositing 101 the initial metal layer comprising Ni, the initial metal layer comprising Ni 33 is thickened by depositing (FIG. 1, 102) a further metal layer 34 on the initial metal layer comprising Ni 33 in the first area and in the second area. In a method in accordance with preferred embodiments of the present disclosure, depositing 102 the further metal layer 34 comprises performing an electroless metal plating process or an immersion metal plating process. Particularly, in a method in accordance with embodiments of the present disclosure, the step of depositing 102 the further metal layer may comprise depositing the further metal layer 34 on the initial metal layer comprising Ni 33 simultaneously in the first area and in the second area.

In embodiments of the present disclosure, depositing 102 the further metal layer may for example comprise depositing a further Ni layer by performing an electroless nickel plating process. In embodiments of the present disclosure, depositing 102 the further metal layer may for example comprise depositing a further metal layer in a single step. In alternative embodiments, depositing a further metal layer may be performed in multiple steps such as for instance in two steps. Proceeding in two steps is advantageous because it permits, after the first step, to check the quality of the plating before to proceed with the second step. Checking the quality of the initial metal layer comprising Ni much less easy due to the very low thickness typical of this initial metal layer. Proceeding in one step is therefore a relatively blind process.

When performed in a single step, it is preferred that this steps be relatively long such as for instance from 5 to 20 min long, preferably from 6 to 18 min long, more preferably from 8 to 16 min long. When depositing 102 the further metal layer is performed in a single metal deposition step, it is preferred to perform a sintering step (as described above) before the single metal deposition step. This improves adhesion. When depositing 102 the further metal layer is performed in one metal deposition step, it is preferred to perform a step of contacting the silicon substrate with an HF solution (as described above) before the metal deposition step. This improves adhesion. When both a sintering step and an HF contacting step are performed, the sintering step is preferably performed before the HF step. This last embodiment is particularly advantageous as it best increases the adhesion of the further metal layer on the initial metal layer.

When performed in two steps, it is preferred that the first step be shorter than the second step. For instance, the first step may be from 5 to 20 times shorter than the second step. For instance, the first step may be from 0.5 to 3 min long, preferably from 1 to 2 min long while the second step may be from 10 to 30 min long, preferably 12 to 20 min long, more preferably 13 to 17 min long. When depositing 102 the further metal layer is performed in two metal deposition steps, it is preferred to perform a sintering step (as described above) between both metal deposition steps. This improves adhesion. When depositing 102 the further metal layer is performed in two metal deposition steps, it is preferred to perform a step of contacting the silicon substrate with an HF solution between both metal deposition steps. This improves adhesion. When both a sintering step and an HF contacting step are performed, the sintering step is preferably performed before the HF step. This last embodiment is particularly advantageous as it best increases the adhesion of the further metal layer on the initial metal layer. In embodiments of the present disclosure a solderable capping layer may be provided or formed above the further nickel layer. Providing such a solderable capping layer may for example comprise forming a Ag layer, such as for example by performing a Ag immersion plating process. It is an additional advantage of covering the further Ni layer with a thin immersion plated Ag layer, e.g. having a thickness in the range between 150 nm and 600 nm, that it results in an increased conductivity of the first and second metal electrodes.

In embodiments of the present disclosure, depositing 102 the further metal layer may for example comprise depositing a further Ni layer by performing an electroless Ni plating process, depositing a first Ag layer by performing a Ag immersion plating process, and depositing an additional Ni layer on top of the first Ag layer by performing an electroless Ni plating process. Above this additional Ni layer a solderable capping layer may be provided, for example a Ag layer, such as for example by performing a Ag immersion plating process, the present disclosure not being limited thereto.

In embodiments of the present disclosure, depositing 102 the further metal layer may for example comprise depositing a Ag layer on the initial metal layer comprising Ni by performing an electroless Ag plating process or by performing an immersion Ag plating process, the present disclosure not being limited thereto.

In embodiments of the present disclosure, depositing 102 the further metal layer may for example comprise depositing a Cu layer on the initial metal layer comprising Ni by performing an electroless Cu plating process or by performing an immersion Cu plating process, the present disclosure not being limited thereto.

In embodiments of the present disclosure the initial metal layer comprising Ni may for example have a thickness in the range between 4 nanometer and 2 micrometer, the present disclosure not being limited thereto.

A method in accordance with an embodiment of the present disclosure may advantageously be used for providing metal electrodes to busbar-free photovoltaic cells, wherein multiple electrically conductive wires are connected to, e.g. soldered to, the metal electrodes after cell fabrication. Using such approach, the required electrical conductivity of the metal electrodes, e.g. metal fingers, can be lower than in traditional photovoltaic cells having typically three to five busbars. Therefore, metals such as Ni, having a lower electrical conductivity than Ag or Cu, can be used (preferably covered with a thin layer of e.g. Ag) for forming the metal electrodes with a reduced risk of significantly increasing the series resistance of the cells and with a reduced risk of significantly lowering the fill factor of the cells.

Thus, embodiments of the present disclosure may relate to a fabrication method for fabricating a busbar-free photovoltaic cell, in which this fabrication method comprises a step of forming a first metal electrode on an n-type region of a silicon substrate and a second metal electrode on a p-type region of the silicon substrate according to an embodiment of the present disclosure, e.g. such as to form metal fingers of the busbar-free photovoltaic cell.

Examples are provided hereinbelow, which illustrate experiments in which a method according to embodiments of the present disclosure was used for providing metal contacts on a bifacial photovoltaic cell. These examples are provided for illustrating features and advantages of embodiments of the present disclosure, and to aid the skilled person in reducing the disclosure to practice. However, these examples should not be construed as limiting the disclosure in any way.

Example 1: Comparison of the Deposition of an Initial Metal Layer Comprising Ni in Accordance with the Prior Art or an Embodiment of the Present Disclosure In the experiments, a Ni immersion plating process was performed on silicon substrates comprising p-type regions and n-type regions. Monocrystalline n-type Cz silicon substrates were used, the substrates having a diffused p-type region at a first substrate side and a diffused n+-type region at a second substrate side opposite to the first substrate surface. After forming the diffused region, a dielectric layer comprising a silicon nitride layer was deposited on both substrate sides and locally removed by means of laser ablation, to thereby expose the underlying silicon surfaces in first and second areas. This resulted in p-type regions being exposed at the first substrate side (first substrate surface) and n+-type regions being exposed at the second substrate side (second substrate surface). The n+-type regions and the p-type regions were exposed respectively in a first area 1 and a second area 2 consisting of distinct parts having a rectangular shape with a width of about 20 micrometer. Before performing the Ni immersion plating process these substrates were dipped in a 2% HF solution for 90 seconds, to thereby remove any oxide that may be present on the surfaces to be plated, and rinsed. On a first set of silicon substrates a prior art immersion plating process was performed using a plating solution comprising 5.5 mM [Ni] (300 ppm [Ni]) in [$NH_4F$] 30%, with 8.5 pH. More in particular, the plating solution used contained DI water, 5.5 mM of [Ni] (using nickel sulphamate ($Ni(SO_3NH_2)_2$) as a [Ni] source) and 30% $NH_4F$ (corresponding to 300 g $NH_4F$ per 1l of solution). The pH of the plating bath was adjusted by adding $NH_4OH$, to obtain a pH value of 8.5. The temperature of the plating solution was 64° C. and a plating time of two minutes was used. On a second set of silicon substrate an immersion plating process in accordance with an embodiment of the present disclosure was performed, using a plating solution comprising 5.5 mM [Ni] (300 ppm [Ni]) and 0.4 mM [Cu] (25 ppm [Cu]) in [$NH_4F$] 30%, with 8.5 pH. More in particular, the plating solution used contained DI water, 5.5 mM of [Ni] (using nickel sulphamate ($Ni(SO_3NH_2)_2$) as a [Ni] source), 0.4 mM of [Cu] (using copper sulphate ($CuSO_4.5H_2O$) as a [Cu] source) and 30% $NH_4F$. The pH of the plating bath was adjusted by adding $NH_4OH$, to obtain a pH value of 8.5. For part of the second set of silicon wafers a plating temperature of 60° C. was used and a plating time of 10 seconds; for another part of the second set of silicon wafers a plating temperature of 55° C. was used and a plating time of 30 seconds. For both the first set and the second set of substrates, a further Ni layer was afterwards formed on the initial immersion plated layer comprising Ni, by performing an electroless Ni plating process at 84° C. for 12 minutes.

Deposited layer thicknesses of the initial metal layers comprising Ni were estimated based on XRF (X-Ray Fluorescence) measurements. XRF measurements were done over an area covering a circular-shaped region having a diameter of 300 micrometer, whereas the plated initial metal layer comprising Ni had a width of about 20 micrometer. This means that the measurement area was not fully covered by the initial metal layer comprising Ni, although this was assumed when calculating layer thicknesses based on the XRF measurements. Table 1 shows thickness values (arbitrary thickness units) thus calculated for the initial metal layer comprising Ni formed by immersion plating with a plating solution comprising Cu as another metal different from Ni different from Ni as described above (second set of substrates, iNiCu in Table 1) and for initial metal layer comprising Ni formed by immersion plating with a plating solution not comprising another metal different from Ni (first set of substrates, iNi in Table 1) as described above. Thickness values shown in Table 1 are average values based on measurements at five different locations. Because of the approach used for determining these values, the thickness units are arbitrary, but the values reported can be assumed to be proportional to the real thicknesses. Thicknesses were estimated both on n-type regions and on p-type regions. The results show that simultaneous plating is achieved on both n-type regions and p-type regions, with an i-Ni layer thickness that is larger on n-type regions than on p-type regions. The results further show that, using an immersion nickel plating process with a plating bath containing Cu in accordance with an example of an embodiment of the present disclosure, a higher plating speed is obtained both on n-type regions and on p-type regions, as compared to an immersion nickel plating process performed without Cu in the plating bath. It is therefore an advantage of a method according to embodiments of the present disclosure that shorter process times and/or lower deposition temperatures may be used as compared to known immersion plating based processes. It was further observed that the initial metal layer comprising Ni formed according to a method of the present disclosure not only contains Ni but that it also contains Cu, with a larger relative amount of Cu on the n-type regions than on the p-type regions.

TABLE 1

| process | iNi thickness on n-Si [arbitrary units] | iNi thickness on p-Si [arbitrary units] |
| --- | --- | --- |
| iNiCu 10 s 60° C. | 137 | 115 |
| iNiCu 30 s 55° C. | 141 | 117 |
| iNi 2 min 64° C. | 149 | 113 |

Example 2: Fabrication and Comparison of Silicon Photovoltaic Cell Test Structures Fabricated According to the Prior Art or an Embodiment of the Present Disclosure Silicon photovoltaic cell test structures were fabricated, with a thin Ni layer being provided simultaneously in n-type and p-type contact regions by means of an immersion Ni plating process, using the process conditions as described above related to the two sets of silicon substrates for which average layer thicknesses are reported in Table 1. For the second set of silicon wafers immersion Ni plating was performed for 30 seconds at 55° C. No additional layer was provided on top of the thin immersion plated Ni layer. After providing the Ni layer by immersion plating, a sintering step was performed at 350° C. in $N_2$ ($O_2$<10 ppm) for 4 minutes. As described above, the n+-type regions and the p-type regions were exposed respectively in a first area 1 and a second area 2 consisting of distinct parts having a rectangular shape with a width of about 20 micrometer. The first area 1 and the second area 2 corresponded to locations of metal fingers of the silicon photovoltaic cell test structures.

On these test structures the implied open-circuit voltage iVoc and the implied fill factor iFF were determined based on quasi-steady-state photoconductance measurements. Measurements were done before immersion plating, after immersion plating but before sintering, and after sintering. Results for iVoc and iFF as determined on different substrates are shown in Table 2, as well as the relative change (relative delta Δ) of the iVoc and iFF values after sintering as compared to the values before plating. These results show that good, satisfactory iVoc and iFF values may be obtained using a Ni plating method in accordance with an embodiment of the present disclosure. For the test structures, wherein a prior art Ni plating method was used, a substantial reduction of the iVoc and iFF values was observed as a result of the plating process, and the original iVoc and iFF values as determined before plating could not be fully recovered by sintering. The results show, on average, a relative reduction of 2.2% of iVoc and a relative reduction of 4% of iFF after sintering as compared to the initial values. For the test structures, wherein a Ni plating method in accordance with an embodiment of the present disclosure was used, a substantially lower reduction of the iVoc and iFF values was observed as a result of the plating process as compared with the prior art process. For these test structures the original iVoc values as determined before plating could be fully recovered and even slightly improved by sintering, and the original iFF values as determined before plating could be almost fully recovered. The results show, on average, a relative improvement of 0.1% of iVoc and a relative reduction of 0.4% of iFF after sintering as compared to the initial values. This is indicative of that electrodes or contact regions may be formed by a method in accordance with an embodiment of the present disclosure while introducing substantially less damage to the silicon substrate as compared to prior art methods.

TABLE 2

| process | before plating | | after plating | | after sintering | | relative delta Δ | |
|---|---|---|---|---|---|---|---|---|
| | iVoc [mV] | iFF [%] | iVoc [mV] | iFF [%] | iVoc [mV] | iFF [%] | Δ iVoc [%] | Δ iFF [%] |
| iNi | 671.1 | 82.6 | 636.8 | 80.3 | 653.6 | 79.6 | −2.6 | −3.6 |
| 2 min 64° C. | 672.3 | 82.7 | 639.6 | 80.5 | 657.2 | 79.6 | −2.2 | −3.7 |
| | 669.5 | 82.6 | 651.0 | 80.8 | 654.6 | 78.9 | −2.2 | −4.5 |
| | 670.5 | 82.5 | 641.7 | 80.0 | 658.0 | 79.2 | −1.9 | −4.0 |
| | | | average relative Δ | | | | −2.2 | −4.0 |
| iNi | 664.6 | 82.8 | 661.7 | 81.4 | 666.7 | 82.9 | +0.3 | +0.1 |
| | 670.2 | 82.6 | 666.1 | 80.6 | 670.6 | 82.0 | +0.1 | −0.7 |
| | 667.9 | 82.4 | 663.2 | 79.7 | 667.7 | 82.0 | 0.0 | −0.5 |
| | | | average relative Δ | | | | +0.1 | −0.4 |

Example 3: Fabricating Silicon Photovoltaic Cells: General Procedures

In a second aspect, the present disclosure is related to methods for fabricating photovoltaic cells wherein the cell electrodes are provided by a method in accordance with an embodiment of the first aspect of the present disclosure.

For example, an embodiment in accordance with the second aspect of the present disclosure provides a method for fabricating bifacial silicon photovoltaic cells, wherein the method comprises concurrently, such as for example simultaneously, forming at least one first metal electrode on an n-type region of a silicon substrate and at least one second metal electrode on a p-type region of the silicon substrate according to an embodiment of the first aspect of the present disclosure. In a method for fabricating bifacial photovoltaic cells the n-type region and the p-type region are exposed at a surface of the silicon substrate at opposite sides of the substrate.

For example, an embodiment in accordance with the second aspect of the present disclosure provides a method for fabricating back contact silicon photovoltaic cells, wherein the method comprises concurrently, such as for example simultaneously, forming at least one first metal electrode on an n-type region of a silicon substrate and at least one second metal electrode on a p-type region of the silicon substrate according to an embodiment of the first aspect of the present disclosure. In a method for fabricating back contact photovoltaic cells the n-type region and the p-type region are exposed at a surface of the silicon substrate at a same side of the substrate, more in particular at the back side or rear side of the substrate.

For example, an embodiment in accordance with the second aspect of the present disclosure provides a method for fabricating busbar-free silicon photovoltaic cells, wherein the method comprises concurrently, such as for example simultaneously, forming at least one first metal electrode on an n-type region of a silicon substrate and at least one second metal electrode on a p-type region of the silicon substrate according to an embodiment of the first aspect of the present disclosure. In a method for fabricating busbar-free photovoltaic cells the n-type region and the p-type region may be exposed at surface of the silicon substrate at a same side of the substrate or at an opposite side of the substrate.

Embodiments in accordance with the second aspect of the present disclosure are not limited to the examples described herein above. Other photovoltaic cell structures or other photovoltaic cell types may be fabricated in accordance with methods of the present disclosure.

Example 4: Fabrication of Bifacial PERT Silicon Photovoltaic Cells According to Embodiments of the Present Disclosure Bifacial silicon photovoltaic cells were fabricated by a method in accordance with an embodiment of the second aspect of the present disclosure. More in particular, bifacial silicon photovoltaic cells having a Passivated Emitter Rear Totally diffused structure (PERT) were fabricated on n-type silicon substrates.

Figure 6:
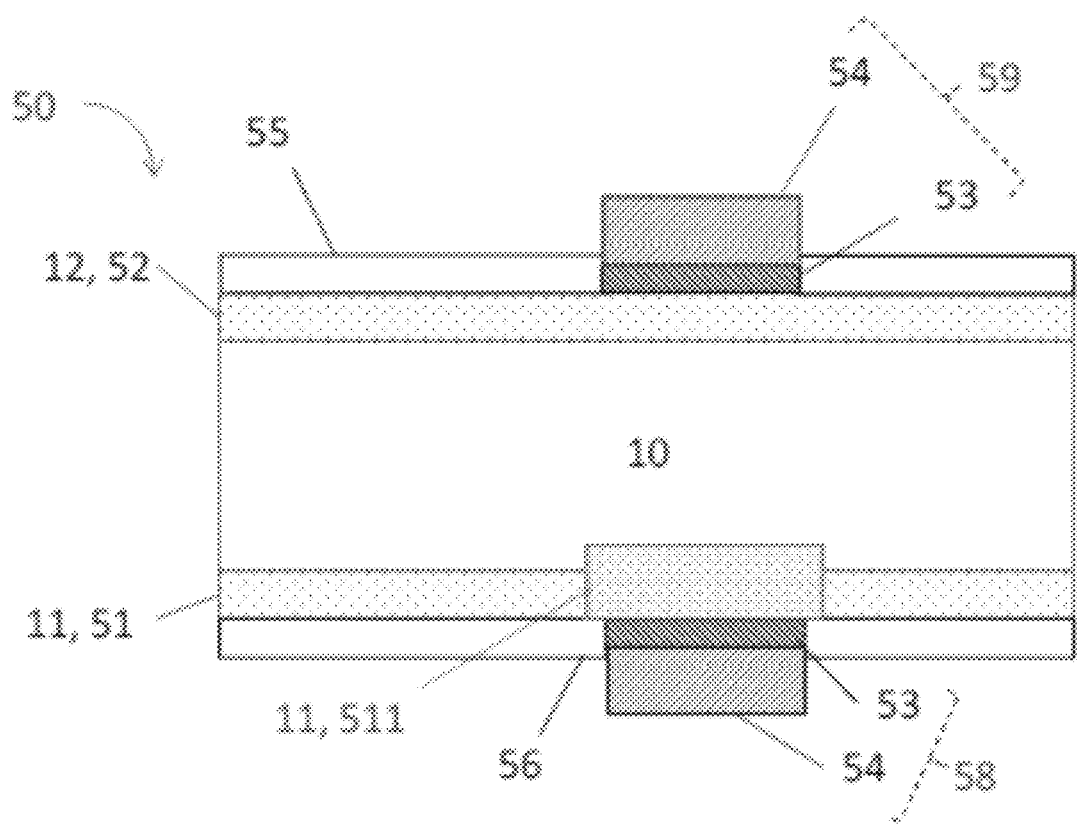
FIG. 6 schematically shows a cross section of a part of a bifacial Passivated Emitter Rear Totally diffused (PERT) silicon photovoltaic cell structure that may be fabricated in accordance with an embodiment of the present disclosure.

FIG. 6 schematically shows a cross section of a part of a bifacial Passivated Emitter Rear Totally diffused (PERT) silicon photovoltaic cell structure 50 that may be fabricated in accordance with an embodiment of the present disclosure. The PERT cell 50 comprises a silicon substrate 10, such as for example an n-type crystalline silicon substrate. The PERT cell 50 further comprises an emitter region 52, such as for example a p-type diffused region, formed at a front side of the substrate 10, and a selective BSF (Back Surface Field) region 51, 511, such as for example an n+-type diffused region, formed at a rear side of the substrate 10. At the rear side of the substrate 50, first electrodes 58 are present, the first electrodes 58 or rear side electrodes providing an electrical contact to the BSF region 51, 511. At the front side of the substrate 50, second electrodes 59 are present, the second electrodes 59 or emitter electrodes providing an electrical contact to the emitter region 52. The selective BSF region comprises first BSF regions 51 and second BSF regions 511, the second BSF regions 511 being provided at the location of the first electrodes 58 and being more heavily doped than the first BSF regions 51 in between. In the example shown in FIG. 6, the first electrodes 58 and the second electrodes 59 comprise an initial metal layer 53, such as for example an initial metal layer comprising Ni, and a further metal layer 54 on top of the initial metal layer 53. The first and second electrodes 58, 59 may for example be provided in accordance with an embodiment of a method of the first aspect of the present disclosure.

Figure 7:
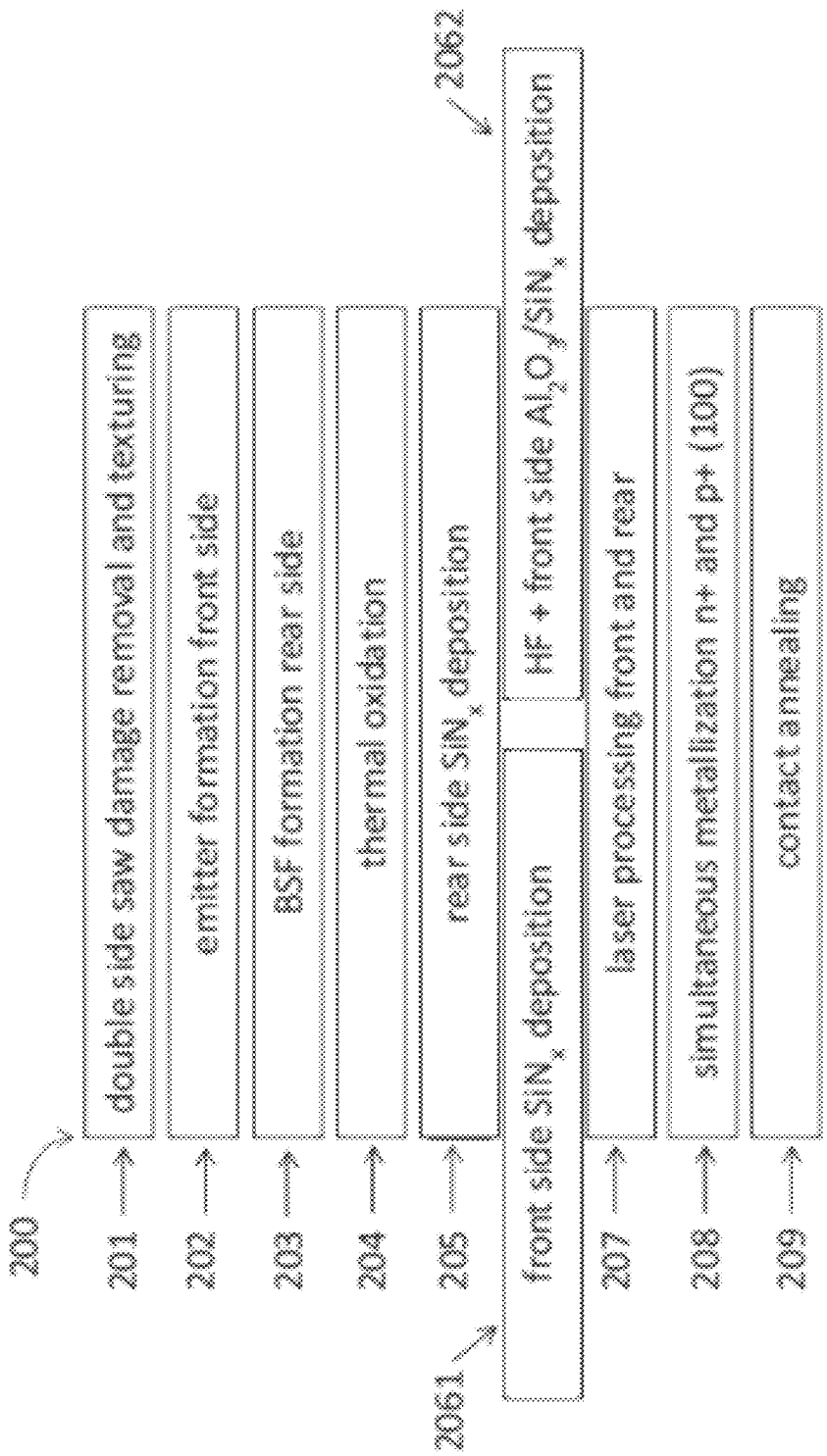
FIG. 7 schematically shows process steps of an exemplary method for fabricating PERT silicon photovoltaic cells as illustrated in FIG. 6, to illustrate features and properties of embodiments of the present disclosure.

FIG. 7 schematically shows process steps of an exemplary method 200 for fabricating PERT silicon photovoltaic cells as illustrated in FIG. 6, to illustrate features and properties of embodiments of the present disclosure.

In the exemplary method 200 illustrated in FIG. 7, after double side saw damage removal and texturing (201) of a silicon substrate 10, for example by immersing the substrate in an etching solution comprising KOH or NaOH, emitter regions 52 are formed (202) at a front side of the substrate. In embodiments wherein the substrate 10 is an n-type substrate, emitter regions 52 may for example be formed by performing a BBr3 diffusion. In embodiments wherein the substrate 10 is a p-type substrate, emitter regions may for example be formed by performing a $POCl_3$ diffusion. The diffused layer may be subsequently removed from the rear side of the substrate, for example by means of single side wet etching. After a front-side masking step, BSF regions 51 are formed at the rear side (step 203), for example by $POCl_3$ diffusion in embodiments with an n-type substrate 10 or for example by BBr3 diffusion in embodiments with a p-type substrate 10. Afterwards, surface passivation layers (front side dielectric layer 55 and rear side dielectric layer 56) are provided at the front surface and at the rear surface of the substrate. Providing surface passivation layers may for example comprise performing a thermal oxidation (204) to provide a silicon oxide layer at the front side and at the rear side of the substrate, followed by deposition of a SiNx layer at the rear side of the substrate (205) and deposition of a SiNx layer at the front side of the substrate (2061). In other embodiments, instead of depositing a SiNx layer at the front side (2061), a stack comprising an $Al_2O_3$ layer, such as for example an Atomic Layer Deposited $Al_2O_3$ layer and a SiNx layer, such as for example a Plasma Enhanced Chemical Vapor Deposited SiNx layer, may be deposited (2062) at the front side after removal of the front side silicon oxide layer. The front side and rear side passivation layers 55, 56 are then patterned (207), for example by means of a laser, e.g. by laser ablation, e.g. ps UV laser ablation, to thereby remove the passivation layers 55, 56 at locations where metal electrodes 58, 59 are to be provided. At the rear side, a laser doping process, e.g. using a phosphorous containing spin-on dopant source may be used to form heavily doped BSF regions 511. Next, a defect annealing step may be performed to mitigate laser damage. This is followed by providing rear side electrodes 58 and front side electrodes 59, for example by simultaneous formation of first metal electrodes 58 on BSF regions 511 and a second metal electrodes on emitter regions 52 (208) by means of a non-contact plating method in accordance with an embodiment of the first aspect of the present disclosure. This may be followed by a contact annealing step (209) to reduce metal-silicon contact resistances.

Example 5: Fabrication of Busbar-Free Bifacial PERT Cells According to Embodiments of the Present Disclosure and the Prior Art Experiments were performed wherein busbar-free bifacial PERT cells having a cell structure as illustrated in FIG. 6 were fabricated on 180 micrometer thick n-type Cz crystalline silicon substrates (resistivity Ohm·cm), using a method in accordance with an embodiment of the present disclosure, in line with the process step sequence illustrated in FIG. 7. The photovoltaic cell area was 239 cm2.

First metal electrodes 58 (rear side electrodes, BSF electrodes) and second metal electrodes 59 (front side electrodes, emitter electrodes) were formed using a method according to an embodiment of the first aspect of the present disclosure. An initial metal layer comprising Ni 53 was deposited simultaneously on emitter regions 52 and on BSF regions 511 by performing a Ni immersion plating process according to an embodiment of the present disclosure. Samples were immersed in a Ni immersion plating solution for 1 minute at 55° C., with agitation. The Ni immersion plating solution contained [$NH_4F$] 30%, [Ni] 5.5 mM (Ni salt: nickel sulphamate $Ni(SO_3NH_2)_2$), [Cu] 0.4 mM (Cu salt: copper sulphate $CuSO_4.5H_2O$) and was adjusted with $NH_4OH$ to obtain a pH of 8.5. After rinsing in deionized water for 5 minutes a further metal layer 54, more in particular a further Ni layer was provided on top of the initial metal layer comprising Ni 53 by performing an electroless Ni plating process. Samples were immersed in a commercially available electroless Ni plating solution for 12 minutes at 82° C., at 4.8 pH. This was followed by rinsing in deionized water for 5 minutes. Next a silver capping layer was provided simultaneously at both sides on top of the further Ni layer by a two-step silver immersion plating process using a commercially available plating solution. This process comprises a first step performed at 38° C. for 30 seconds and a second step performed at 52° C. for 90 seconds. Finally, the cells were annealed for 4 minutes at 350° C. in a nitrogen atmosphere, to improve metal-to-silicon contact resistances and line conductivities.

As a reference, bifacial PERT cells were fabricated according to a similar process, wherein first and second metal electrodes were formed by first providing a Ni seed layer (nickel silicide layer) by means of a Physical Vapor Deposition (sputtering) and salicidation process instead of immersion plating, followed by providing a further Ni layer by electroless plating and a silver capping layer by a two-step plating method as described above.

Table 3 shows measured photovoltaic cell characteristics for busbar-free bifacial PERT cells fabricated in accordance with an embodiment of the present disclosure (iNi+ in Table 3) and for busbar-free bifacial PERT cells fabricated with a sputtered seed layer (PVD Ni in Table 3). The cells had a thermal SiOx/PECVD SiNx passivation layer on both the front surface and the rear surface. Average values based on measurements on four cells are shown for the iNi+ cells and the corresponding PVD Ni reference cells, as well as the best values obtained.

The cell characteristics were measured under front side illumination with a calibrated solar simulator, using a Pasan GridTOUCH contact system, with 30 wires for current extraction on the front and rear sides and 5 wires for voltage measurement on the front and rear sides, on a low-reflection back chuck (N. Bassi et al, "GridTOUCH: Innovative solution for accurate IV measurement of busbar-free cells in production and laboratory environments", Proc. 29th EUPVSEC, 1180-1185). The following characteristics are given in Table 3: short-circuit current density Jsc, open-circuit voltage Voc, fill factor FF, cell efficiency, bifaciality, series resistance Rs and pseudo fill factor pFF. The short-circuit current density values shown in Table 3 are corrected to remove measurement wire shading effects. Since finger line (metal line) resistance is relatively high in these busbar-free cells, there is a small but significant voltage offset between the voltage and the current wires of the Grid-TOUCH system, which causes cell fill factors to be over-estimated. The fill factor values shown in Table 3 are downwards corrected values obtained from re-plotting the current-voltage curves taking this effect into account. The bifaciality is defined as the ratio of the short circuit current density Jsc measured when the back side of the cell is illuminated to the short circuit current density Jsc measured when the front side of the cell is illuminated.

TABLE 3

|  |  | $J_{sc}$ [mA/cm$^2$] | $V_{oc}$ [mV] | FF [%] | efficiency [%] | bifaciality [%] | Rs [Ohm · cm$^2$] | pFF [%] |
|---|---|---|---|---|---|---|---|---|
| iNi+ | average | 40.2 | 671 | 79.7 | 21.5 | 96.2 | 0.8 | 84.5 |
|  | best | 40.2 | 672 | 79.6 | 21.5 | 96.8 | 0.7 | 84.7 |
| PVD Ni | average | 40.4 | 673 | 79.6 | 21.6 | 95.9 | 0.7 | 84.5 |
|  | best | 40.4 | 676 | 79.7 | 21.8 | 96.1 | 0.7 | 84.6 |

These experimental results show that a similar electrical performance may be obtained for photovoltaic cells having first and second electrodes provided in accordance with an embodiment of the present disclosure, as compared to photovoltaic cells having first and second electrodes provided using a method comprising first forming a nickel seed layer (nickel silicide layer) by PVD deposition and salicidation.

Implied open-circuit voltages iVoc and implied fill factors iFF of the iNi+ cells were measured after patterning of the front and rear side passivation layers (before providing the initial metal layer comprising Ni) and after providing an initial metal layer comprising Ni in accordance with a method of the present disclosure and sintering for 4 minutes at 350° C. Average values for six cells show an increase in iVoc from 670.5 mV to 672.1 mV and an increase in iFF from 82.8% to 83.2% after nickel plating and sintering.

Also for bifacial PERT cells fabricated in accordance with a method of the present disclosure as described above, but with an AlOx/SiNx passivation layer at the front side instead of a SiOx/SiNx passivation layer, a slight improvement of iVoc and iFF was measured after Ni plating and sintering. More in particular, average values based on three cells show an increase in iVoc from 682.8 mV to 684.6 mV and an increase in iFF from 81.8% to 83.0%. This illustrates that a method for forming first electrodes and second electrodes in accordance with an embodiment of the present disclosure counteracts a deterioration of the electrical performance of the photovoltaic cells, indicating that there is no or a reduced electrical damage induced by the plating method used.

For bifacial silicon photovoltaic cells fabricated in accordance with a method of the present disclosure as described above, but with an AlOx/SiNx passivation layer at the front side instead of a SiOx/SiNx passivation layer, cell efficiencies up to 22.8% were measured. For the best performing cell the following electrical characteristics were measured: short-circuit current density Jsc 40.5 mA/cm2, open circuit voltage Voc 694 mV, fill factor FF 81.1%, and cell efficiency 22.8%. On 44 prepared cells, the average Jsc was 40.4±0.1 mA/cm2, the average Voc was 691.2±1.6 mV, the FF was 80.3±0.6%, and the cell efficiency was 22.4±0.2%. Bifaciality was measured for a representative bifacial n-PERT cell to be 97.4%, 99.9%, 99.9%, and 97.2% for Jsc, Voc, FF, and cell efficiency respectively.

In addition, experiments were done wherein bifacial PERT cells were fabricated according to a similar process, wherein first and second metal electrodes were formed by first providing an initial metal layer comprising Ni by means of a prior art immersion plating process (without another metal different from Ni in the plating solution) instead of a plating process according a method of the present disclosure. As a reference, bifacial PERT cells were fabricated according to a similar process, wherein first and second metal electrodes were formed by first providing a Ni seed layer (nickel silicide layer) by means of a Physical Vapor Deposition (sputtering) and salicidation process instead of immersion plating, followed by providing a further Ni layer by electroless plating and a Ag capping layer by a two-step plating method as described above.

Table 4 shows measured photovoltaic cell characteristics for these busbar-free bifacial PERT cells fabricated with a prior art immersion plated initial metal layer comprising Ni (iNi in Table 4) and for busbar-free bifacial PERT cells fabricated with a sputtered seed layer (PVD Ni in Table 4). The cells had a thermal SiOx/PECVD SiNx passivation layer on both the front surface and the rear surface. Only the characteristics obtained for the best cells are shown in Table 4: short-circuit current density Jsc (corrected to remove measurement wire shading), open-circuit voltage Voc, fill factor FF (not corrected for finger line resistance effects), and cell efficiency.

TABLE 4

|  | $J_{sc}$ [mA/cm$^2$] | $V_{oc}$ [mV] | FF [%] | efficiency [%] |
|---|---|---|---|---|
| iNi | 40.3 | 660 | 76.9 | 20.5 |
| PVD Ni | 40.1 | 672 | 80.7 | 21.7 |

The results for the iNi and corresponding PVD Ni cells illustrate that, when using a prior art immersion plating process for forming the initial metal layer comprising Ni, a deterioration of the electrical performance is observed as compared to photovoltaic cells having first and second electrodes formed using a method comprising first forming a Ni seed layer by PVD deposition and salicidation. This deterioration is mainly reflected in a significantly lower open-circuit voltage and a significantly lower fill factor.

Figure 8:
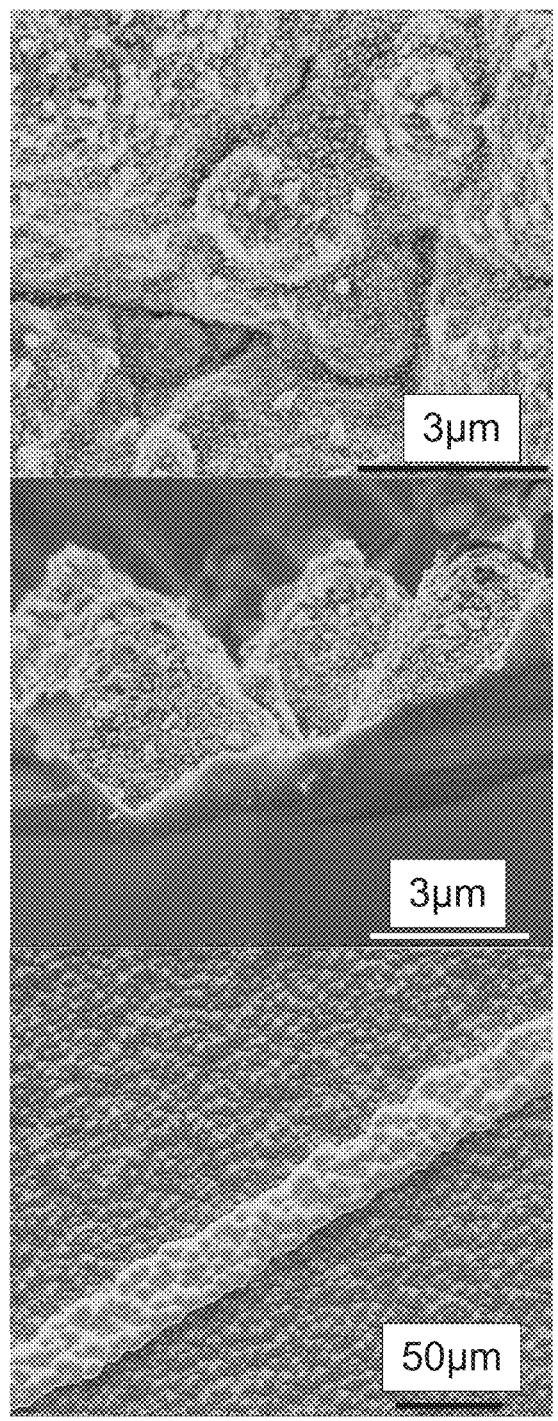
FIG. 8 (top) shows a top view of the Ni plating on the p-surface as observed by an electronic microscope.

Example 6: A Typical Bifacial Plating Process According to an Embodiment of the Present Disclosure In this example, silicon substrates comprising p-type line regions on a first side of the substrate and n-type line regions on the opposite side of the substrate were plated by a process according to an embodiment of the present invention. First, the regions were selectively activated by an immersion Ni plating process as described in Example 1 but with an immersion time of 2 minutes at 55° C. using a plating solution comprising 10 mM [Ni] (300 ppm [Ni]) and 0.4 mM [Cu] in [NH4F] 30%, with 8.5 pH, thereby forming an initial metal layer comprising Ni. FIG. 8 (top) shows a top view of the Ni plating on the p-surface as observed by an electronic microscope. A good seed layer coverage is observed. FIG. 8 (middle) shows a side view of the nickel plating on the p-surface as observed by an electronic microscope. A good seed layer coverage is observed. FIG. 8

(bottom) shows a top view of the nickel plating on the p-surface as observed by an electronic microscope. No ghost plating was observed. Next, a further Ni layer was provided on top of the initial metal layer by performing an electroless Ni plating process for 15 minutes using a commercial electroless Ni solution from MacDermid™. Next, a silver capping was formed on the further Ni layer by a silver immersion plating process for 2 to 6 minutes at from 48 to 54° C. by using a commercially available plating solution from MacDermid™ (Helios Silver IM 448). This capping step improves line conductivity. Finally, the substrates were sintered for about 4 minutes at 350° C. in an oxygen-poor atmosphere to reduce line contact resistance.

Example 7: Reducing the Line Resistance to Less than 10 Ohm/Cm while Using a Method Involving a Forming a Solderable Ag Capping Layer by a Ag Plating Process According to an Embodiment of the Present Disclosure Currently, in photovoltaic panels, about 30 smart wires in laminates are required to obtain good fill factors. To reduce costs, less wires could be used (e.g. 18) but this would require the line resistance to be reduced (e.g. to less than 10 ohm/cm). The inventors made a multifactor analysis to determine what factors played a significant role in achieving a low line resistance when a Ag capping layer is used. Two pump flows (30 rpm and 60 rpm), two Ag plating temperatures (48° C. and 54° C.), two Ag plating durations (2 min and 6 min), to agitation protocols (with and without agitation) and two cycles protocols (a one-step Ni/Ag protocol and a two steps Ni/Ag/Ni/Ag protocol) were included in this analysis. The outputs that were measured were Ag and Ni thicknesses, line resistance, and adhesion. From this analysis, time, temperature and the number of steps were found to be significant. In particular, longer times, higher temperatures, and a smaller number of steps, each gives lower line resistance.

From this analysis, we can conclude that a temperature higher than 48° C. is preferred for the Ag plating step, and that a Ag plating time larger than 2 minutes is preferred for the Ag plating step. When example 6 was performed with a one-step protocol, a 6 min Ag plating step at 54° C., a line resistance of 3.3 ohm/cm could be achieved.

Example 8: Reducing Peeling and Low Adhesion while Obtaining a Line Resistance of Less than 10 Ohm/Cm while Using a Method Involving a Forming a Solderable Ag Capping Layer by a Ag Plating Process According to an Embodiment of the Present Disclosure Thicker Ag capping layer tend to lead to peeling/adhesion decrease. This is mostly apparent on the n-LD (laser doped) side due to the relatively flatter surface obtained on that side. In order to improve adhesion, two protocols where found to give good results.

Example 8a: First Protocol

In this first protocol, silicon substrates comprising p-type line regions on a first side of the substrate and n-type line regions on the opposite side of the substrate were plated by a process according to an embodiment of the present invention. First, the regions were selectively activated by an immersion Ni plating process as described in Example 6. Next, a further Ni layer was provided on top of the initial metal layer by performing a short electroless Ni plating process for 1.5 minutes using a commercial electroless Ni solution from MacDermid™. Next, the substrates were sintered for about 4 minutes at 350° C. in an oxygen-poor, nitrogen-rich atmosphere, next an immersion in HF 2% for 1 minute was performed, next, yet a further Ni layer was provided by performing a long electroless Ni plating process for 15 minutes using a commercial electroless Ni solution from MacDermid™, finally, a silver capping was formed on the further Ni layer by a silver immersion plating process for 4.5 minutes at 54° C. by using a commercially available plating solution from MacDermid™. No peeling was observed and a tape test revealed that both the n-side (laser doped, relatively flat and typically bad for adhesion) and the p-side (laser ablated, relatively rough and improving adhesion) were resisting to scratching.

Figure 9:
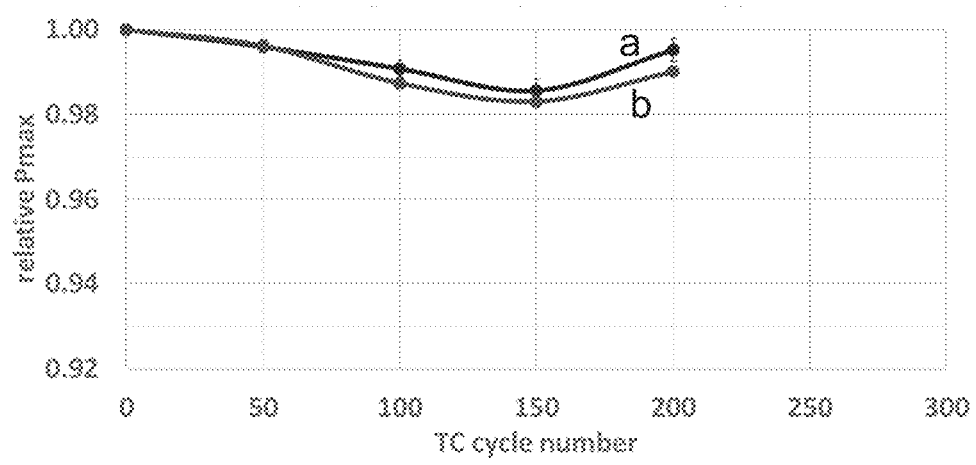
FIG. 9 compares the relative maximal power (Pmax), for the samples obtained according to Example 8a and for samples obtained by Ag screen printing, as a function of the number of cycles in a thermal cycling experiment as described in the standard IEC 61215 of 2005.

This protocol has the further advantage to permit checking that the plating is good before sintering. This is less easy in the next protocol due to the very thin first Ni layer present just before sintering. This protocol permitted to obtain 11.5 µm wide lines having a line resistance of 10 ohm/cm in 4.5 min of silver immersion plating while for a 34.7 wide line, 2 minutes where sufficient. FIG. 9 compares the relative maximal power (Pmax), for the samples obtained according to Example 8a and for samples obtained by Ag sputtering, as a function of the number of cycles in a thermal cycling experiment as described in the standard IEC 61215 of 2005. As can be seen in this graph, the performance of the samples according to the present invention is comparable to the performance of reference sputtered samples with less than 2% loss over 200 cycles. Adhesion after 200 cycles was good as confirmed by series resistance maps.

Example 8b: Second Protocol

In this second protocol, silicon substrates comprising p-type line regions on a first side of the substrate and n-type line regions on the opposite side of the substrate were plated by a process according to an embodiment of the present invention. First, the regions were selectively activated by an immersion Ni plating process as described in Example 6. Next, the substrates were sintered for about 4 minutes at 350° C. in an oxygen-poor, nitrogen-rich atmosphere, next an immersion in HF 2% for 1 minute was performed, next, a further Ni layer was provided by performing a long electroless Ni plating process for 15 minutes using a commercial electroless Ni solution from MacDermid™. Next, finally, a silver capping was formed on the further Ni layer by a silver immersion plating process for 4.5 minutes at 54° C. by using a commercially available plating solution from MacDermid™. No peeling was observed and a tape test revealed that both the n-side (laser doped, relatively flat and typically bad for adhesion) and the p-side (laser ablated, relatively rough and improving adhesion) were resisting to scratching. This protocol has the advantage to be shorter the previous protocol.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated. Whereas the above detailed description as well as the summary of the disclosure has been focused on a method for fabricating a device, the present disclosure also relates to a device, such as a photovoltaic device, fabricated using a method according to any of the embodiments as described above.

The invention claimed is:

1. A method comprising:
   depositing, via immersion of a substrate in a plating solution comprising nickel and another metal, a first layer comprising nickel on an n-type region of the substrate and on a p-type region of the substrate; and
   depositing a second layer on the first layer, thereby forming a first electrode on the n-type region and a second electrode on the p-type region.

2. The method of claim 1, wherein the other metal has a redox potential that is greater than a redox potential of nickel.

3. The method of claim 1, wherein the other metal is copper.

4. The method of claim 1, wherein the plating solution includes 250 parts per million (ppm) to 350 ppm of nickel and includes 5 ppm to 250 ppm of the other metal.

5. The method of claim 4, wherein the plating solution includes 20 ppm to 50 ppm of the other metal.

6. The method of claim 1, wherein depositing the second layer comprises depositing the second layer on the first layer simultaneously on the n-type region and on the p-type region.

7. The method of claim 1, wherein depositing the second layer comprises depositing nickel by an electroless nickel plating process.

8. The method of claim 1, further comprising forming a solderable capping layer on the second layer.

9. The method of claim 8, wherein forming the solderable capping layer comprises forming a silver layer by a silver plating process.

10. The method of claim 8, wherein forming the solderable capping layer comprises forming a silver layer by a silver immersion plating process, and wherein the silver layer has a thickness in a range between 150 nm and 600 nm.

11. The method of claim 1, wherein depositing the second layer comprises depositing a silver layer by an electroless silver plating process or by an immersion silver plating process.

12. The method of claim 1, further comprising performing a sintering step at a temperature in a range between 250° C. and 450° C.

13. The method of claim 1, wherein the n-type region and the p-type region are on a same side of the substrate.

14. The method of claim 1, wherein the n-type region and the p-type region are on opposite sides of the substrate.

15. The method of claim 1, further comprising using the substrate, the first electrode, and the second electrode to fabricate a bifacial photovoltaic cell.

16. The method of claim 1, further comprising using the substrate, the first electrode, and the second electrode to fabricate a back-contact photovoltaic cell.

17. The method of claim 1, wherein the substrate is a crystalline silicon substrate.

18. The method of claim 1, wherein depositing the first layer comprises depositing the first layer simultaneously on the n-type region and on the p-type region.

19. The method of claim 1, wherein depositing the second layer comprises depositing the second layer by an electroless metal plating process or by an immersion metal plating process.

20. The method of claim 1, wherein the substrate comprises silicon.

* * * * *